United States Patent [19]

Dehaine et al.

[11] Patent Number: 4,774,633
[45] Date of Patent: Sep. 27, 1988

[54] METHOD FOR ASSEMBLING AN INTEGRATED CIRCUIT WITH RAISED CONTACTS ON A SUBSTRATE, DEVICE THEREBY PRODUCED AND AN ELECTRONIC MICROCIRCUIT CARD INCORPORATING SAID DEVICE

[75] Inventors: Gérard Dehaine, Chatillon; Alain Peytavy, Versailles, both of France

[73] Assignee: Bull S.A., Paris, France

[21] Appl. No.: 877,754

[22] Filed: Jun. 24, 1986

[30] Foreign Application Priority Data

Jun. 26, 1985 [FR] France ............................ 85 09732

[51] Int. Cl.⁴ ............................................ H05K 1/00
[52] U.S. Cl. .................................. 361/398; 235/492; 357/80
[58] Field of Search ..................... 361/398; 357/80; 235/487, 489, 492; 29/831, 839, 843

[56] References Cited

U.S. PATENT DOCUMENTS

| | | | |
|---|---|---|---|
| 3,670,404 | 6/1972 | Kamoshida | 29/574 |
| 3,719,981 | 3/1973 | Steitz | 29/423 |
| 3,868,724 | 2/1975 | Perrino | 357/65 |
| 4,087,314 | 5/1978 | George et al. | 156/643 |
| 4,216,577 | 8/1980 | Badet et al. | 29/831 |
| 4,222,516 | 9/1980 | Badet et al. | 235/492 |
| 4,264,917 | 4/1981 | Ugon | 357/74 |
| 4,412,642 | 11/1983 | Fisher, Jr. | 29/843 X |
| 4,463,971 | 8/1984 | Hoppe et al. | 235/492 X |
| 4,549,247 | 10/1985 | Hoppe et al. | 301/388 |
| 4,603,249 | 7/1986 | Hoppe et al. | 235/492 |
| 4,604,644 | 8/1986 | Beckham et al. | 357/80 |
| 4,621,190 | 11/1986 | Saito et al. | 235/492 |

FOREIGN PATENT DOCUMENTS

| | | |
|---|---|---|
| 2337381 | 6/1979 | France . |
| 2439322 | 5/1980 | France . |
| 2439438 | 5/1980 | France . |
| 2439478 | 5/1980 | France . |

*Primary Examiner*—A. D. Pellinen
*Assistant Examiner*—Derek S. Jennings
*Attorney, Agent, or Firm*—Kerkam, Stowell, Kondracki & Clarke

[57] ABSTRACT

A device in the form of a contact assembly or package (10) for use in a card (26), such as a credit card. The package includes a substrate (11) having contact holes (16) extending therethrough. The holes are covered by a metal layer (15) on the substrate. Terminals (14) of an integrated circuit (12) are soldered to the metal layer (15) through the holes (16) of the substrate (11). The terminals have a height approximately equal to the thickness of the substrate (11).

25 Claims, 3 Drawing Sheets

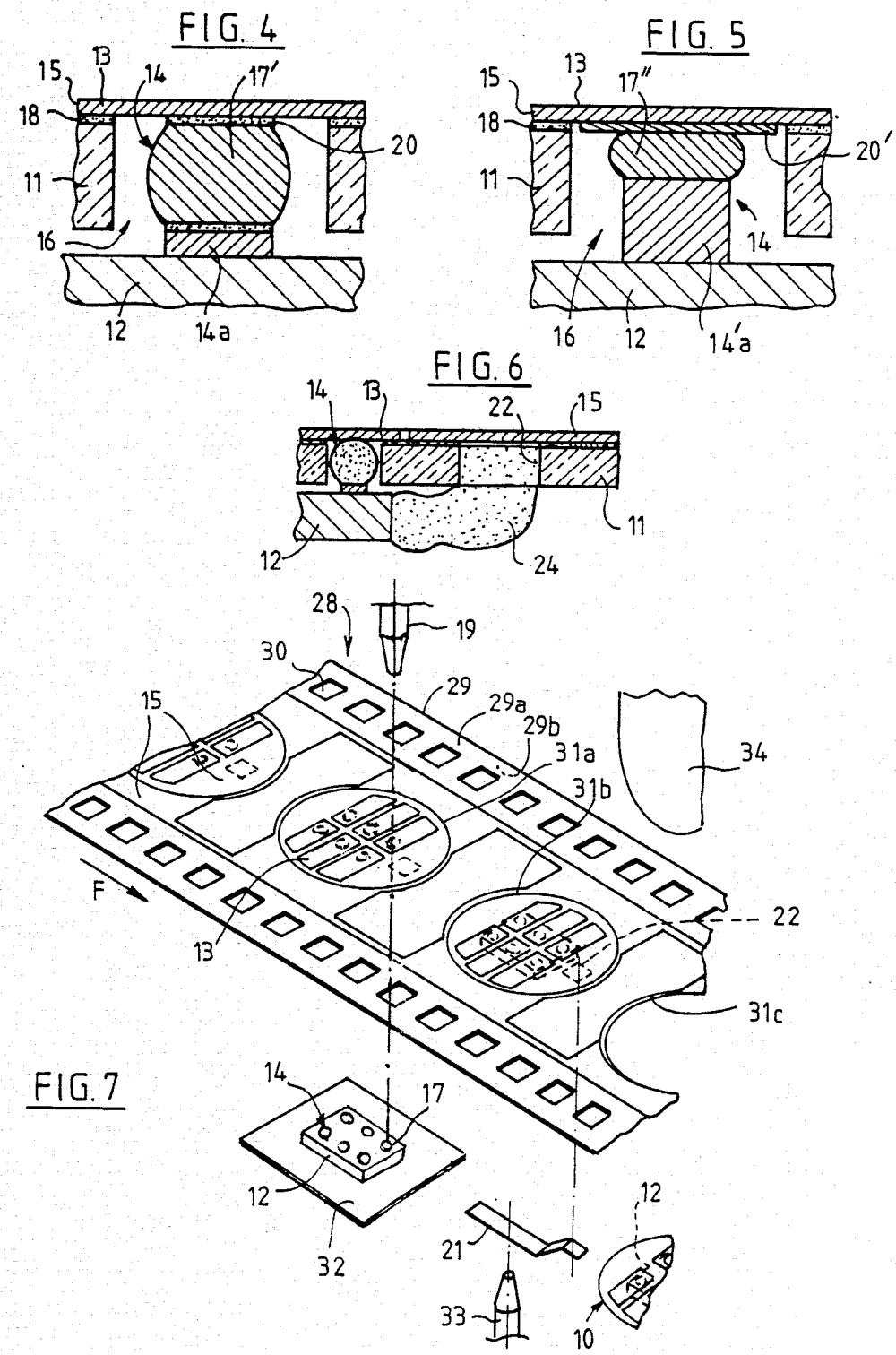

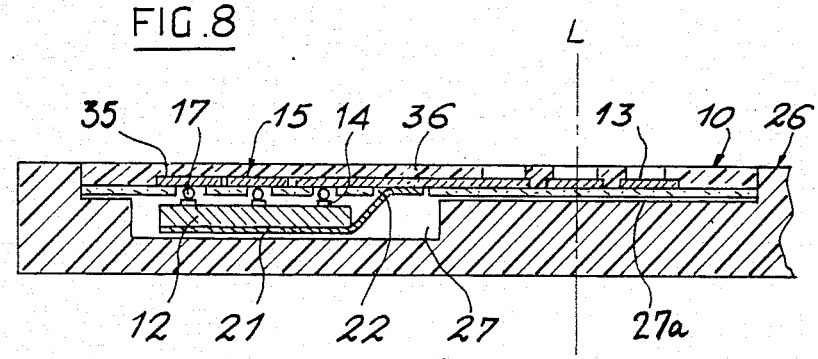
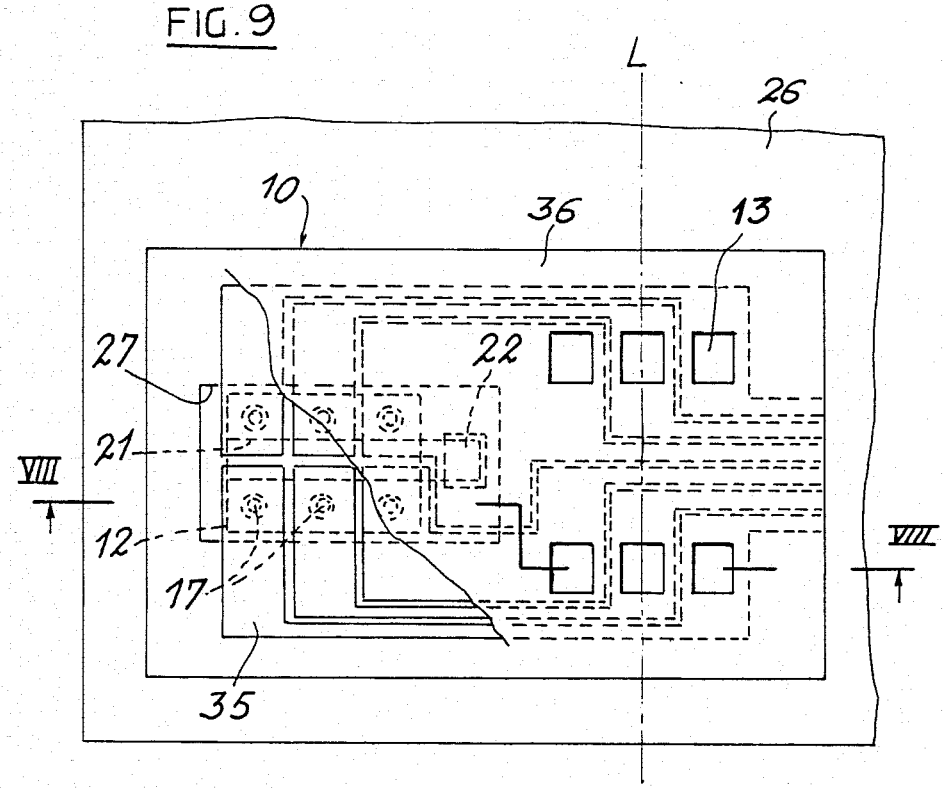

METHOD FOR ASSEMBLING AN INTEGRATED CIRCUIT WITH RAISED CONTACTS ON A SUBSTRATE, DEVICE THEREBY PRODUCED AND AN ELECTRONIC MICROCIRCUIT CARD INCORPORATING SAID DEVICE

FIELD OF THE INVENTION

The invention relates to a method for assembling an integrated circuit on a substrate and the mounting of the device produced thereby to a card having electronic microcircuits, and more particularly to a portable card having a thickness in accordance with ISO (International Organization for Standardization) standards for credit cards, that is, 0.76 mm±10%.

BACKGROUND OF THE INVENTION

An electronic microcircuit card is a card ordinarily made from a rectangular sheet of plastic material which incorporates electronic microcircuits carried by a substrate and having contacts on the exterior for connecting the electronic microcircuits to an apparatus for processing cards. The electronic microcircuits may be intended for quite varied functions, such as for bank debiting and crediting operations, for allocating telephone message units and for confidential input into a classified system. Generally, the microcircuits comprise processing and/or memory circuits of variable complexity depending on their intended use. In practice, they are formed on as least one silicon microchip, currently known as an integrated circuit or chip. For convenience, the term "chip" will be used here.

The chip substrate contained in the card is typically a very thin sheet of plastic material including the elements for interconnection between the chip or chips and the contacts on the card. In a particular instance, the substrate has the card contact on one of its faces, while its other face has the chip or chips and their elements for interconnection with the contacts. All this comprises a device known as a contact assembly or package, which includes all the functional elements of the card; the term "package" will be used here. Accordingly, manufacturing the card merely comprises incorporating the package into the plastic material of the card, such that the contacts of the package are flush with one face of the card and that the chip and its circuits will be protected under the package by a minimum thickness of the plastic material making up the card. Assembling the package is done at present by inserting it into a cavity on the card, but it may also be done by being embedded in the plastic material of the card. The invention relates to the manufacture of a package of this kind.

A package of this type must first of all meet the usual conditions for the use of flexible portable cards intended for the general public. To do so, the package must have sufficient mechanical strength to protect the chip and its interconnection elements from the stresses the substrate undergoes when the card is being manipulated. Meanwhile, the package must be flexible enough to match its bending and twisting to the bending and twisting the card can ordinarily be subjected to, yet without damage to the chip, its elements for interconnection with the contacts, and the soldering between the elements and the chip.

A package of this type must also be able to be incorporated into a card having a thickness that meets ISO standards for credit cards, that is, 0.76 mm±10%, while leaving a sufficient thickness of plastic material underneath the package to protect the chip and its interconnection elements. In terms of nominal values, it has been found in practice that the minimum thickness of the plastic material for protection purposes is about 0.20 mm, which leaves a thickness of only 0.56 mm for the package itself. In the package, a chip already occupies a thickness of 0.30 mm, which is obtained after machining down the original thickness of a standard chip. This leaves a possible thickness of only 0.26 mm for the assembly comprising the substrate, the contacts and the elements for connecting the terminals of the chip to the respective contacts of the package. In this assembly, as noted above, the support must have sufficient mechanical strength, which in practice requires that a thickness on the order of 0.1 mm. Finally, the contacts are generally formed beginning with a copper foil glued to the substrate and then engraved and covered with a layer of gold and at least one intermediate compatibility layer, of nickel, for example.

On the other hand, to be well suited to large-scale mass production of cards at low cost, the method for manufacturing a package must be simple and economical. A method of large-scale production of packages for cards is clearly of technical and commercial interest only if it involves a minimum of components and method steps. Simplicity becomes even more important considering that given the constraints on the thickness of a package, its mass production must also accommodate relatively wide ranges of tolerance for each element of the package. Simplicity thus becomes a fundamental and decisive factor in choosing one method among all the possible methods.

Finally, in practice, it has been found that for a great number of different specific services, the corresponding cards require the use of packages of relatively large width, on the order of 4 to 8 mm on a side, for example. Furthermore, any card can include only a low number of contacts, for example 8, in the case of a credit card. This limits the terminals of the corresponding chip to the same number, which may even be fewer in certain cases. On a large chip, the terminals can be spaced sufficiently far apart from one another to be connected directly to the respective contacts of the card. Thus for large chips there exists the possibility to further simplify the methods of manufacture and make it unnecessary to connect the terminals of the chip to the contacts of the package via connection elements such as wires and conductors that are either free or integral with the substrate.

Previous methods of manufacturing packages do not meet all the conditions described above, especially if the packages are intended for use on cards of standardized thickness.

A present method of manufacture of such packages is described in French Patent No. 2 439 478, corresponding to U.S. Pat. No. 4,264,917 to Ugon, and assigned to the assignee of the present invention. The method comprises piercing holes in the substrate, gluing a copper foil on one face of the substrate and engraving it and then gold-plating it to form the contacts of the package, metal-plating the holes, and then proceeding with the steps of applying and photoengraving a conductive layer on the other face of the substrate to form connection zones, and soldering the input/output elements of the integrated circuits carried on one or two chips onto these connection zones. In other words, this method utilizes the technology of metallized holes and of metallization on both faces of the substrate. Thus, not only is this method complicated, but the resultant package proves to be expensive and bulky.

A variant being used at present comprises making an opening in the substrate for gluing the chip directly onto part of the copper foil, which seals this opening. Advantageously, the corresponding package is slight in thickness because the thickness of the substrate is not added to that of the chip, and the portion of the copper underneath the chip promotes the removal of heat produced by the microcircuits and can be used to polarize a chip of the N-MOS type. However, connecting the chip directly to the thin outer sheet of copper foil has the disadvantage of making the chip more vulnerable to the pressure, torsion and bending that the general public may impose on flexible cards in the course of normal use. Furthermore, the manufacturing method remains complex and expensive, and it also requires that the chip terminals be connected by wires to the connection zones having the contacts.

An improvement of these manufacturing methods has been proposed in French Patent Nos. 2 439 322 and 2 439 438 also assigned to the assignee of the present invention. In this improvement, the ends of the conductive fingers of the chip are fixed directly to respective contacts in the holes which are pierced into the substrate, closed by the contacts, and at least partially filled with solder. Nevertheless, adding the solder to the holes is a very delicate step in the method. Furthermore, either before or after the soldering, an equally delicate operation of bending the conductive fingers accurately must be performed.

It should be noted that in addition to the defects peculiar to particular methods, there is another disadvantage common to all the previous methods described above. This is that all these methods require the presence of connection elements between the terminals of the chip and the contacts of the package. These connection elements are the connecting wires, or the conductive fingers of the chips, or the conductors formed beginning at a metal layer resting on the inside face of the substrate of the package, or a combination of these elements. The use of connecting wire represents the technology known as "wire bonding". Adding conductive fingers to the chips may be done by the technique of mounting chips on a tape, which is presently known as TAB, for tape automatic bonding. Finally, the formation of conductors on the substrate may be done by gluing and engraving of a sheet of copper foil, or by metal plating. In other words, all the previous methods necessarily include steps that involve expensive and sometimes delicate operations.

OBJECT AND SUMMARY OF THE INVENTION

The present invention meets all the aforementioned conditions and thus has the advantage of easily obtaining, at low cost, a package which is mechanically strong, is slight in thickness, has a simple structure and enables direct connection of the terminals of the chip to the contacts of the package.

The invention relates, first, to a method of mounting an integrated circuit on a substrate, comprising piercing holes in the substrate, closing the hole with a metal layer applied to one face of the substrate and soldering connection elements of an integrated circuit to the metal layer facing the holes. In accordance with the invention, the terminals of the integrated circuit have a height that is approximately equal to the thickness of the substrate, so as to comprise the aforementioned connection elements.

As a corollary, a carrier device for integrated circuits according to the invention includes a substrate pierced with holes and having one face provided with a metal layer that closes the holes and having another face provided with at least one integrated circuit having its connection elements soldered in the holes in the aforementioned metal layer. In accordance with the invention, the connection elements are respective contacts of the integrated circuit, having a height approximately equal to the thickness of the substrate.

The invention also relates to an electronic microcircuit card, of the type incorporating a contact assembly of package which has on one face a metal layer having the contacts of the card and which includes at least one integrated circuit. In accordance with the invention, the package results from the device produced in the manner described above.

The characteristics and advantages of the invention will become apparent from the ensuing description made by way of example and taken in conjunction with the drawings.

BRIEF DESCRIPTION OF THE DRAWINGS

FIG. 4 is a view similar to FIG. 3C, illustrating an alternate mode of manufacturing a package according to the invention;

FIG. 5 is a view similar to that of FIG. 3C of another alternate mode of manufacturing a package according to the invention;

FIG. 6 is a fragmentary sectional view, similar to that of FIG. 1, showing an alternate embodiment of a device for polarizing the chip for a package according to the invention;

FIG. 7 is a perspective view of an alternate embodiment of a device according to the invention, on the basis of which various steps in the manufacture and use of this device are suggested;

FIG. 8 is a sectional view, taken along the line VIII—VIII of FIG. 9 and similar to that of FIG. 1, of an alternate embodiment of a package according to the invention, mounted in a portable card, only a fragmentary portion of which is shown; and FIG. 9 is a plan view, similar to that of FIG. 2, of the package and the portion of the card shown in FIG. 8.

DESCRIPTION OF THE PREFERRED EMBODIMENTS

Figure 1:
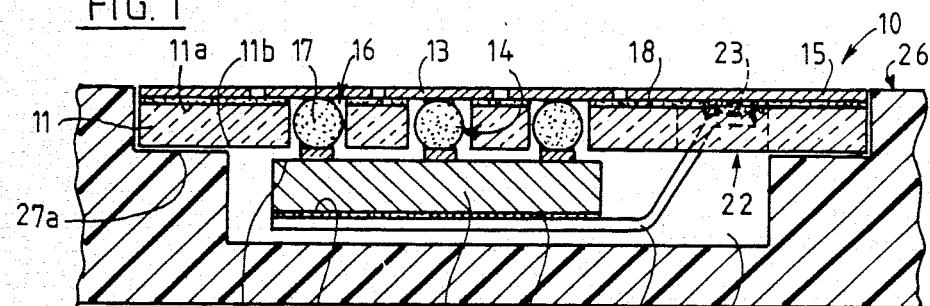
FIG. 1 is a sectional view, taken along the line I—I of FIG. 2, of an embodiment of a package according to the invention, mounted in a portable card which is shown in part.
Figure 2:
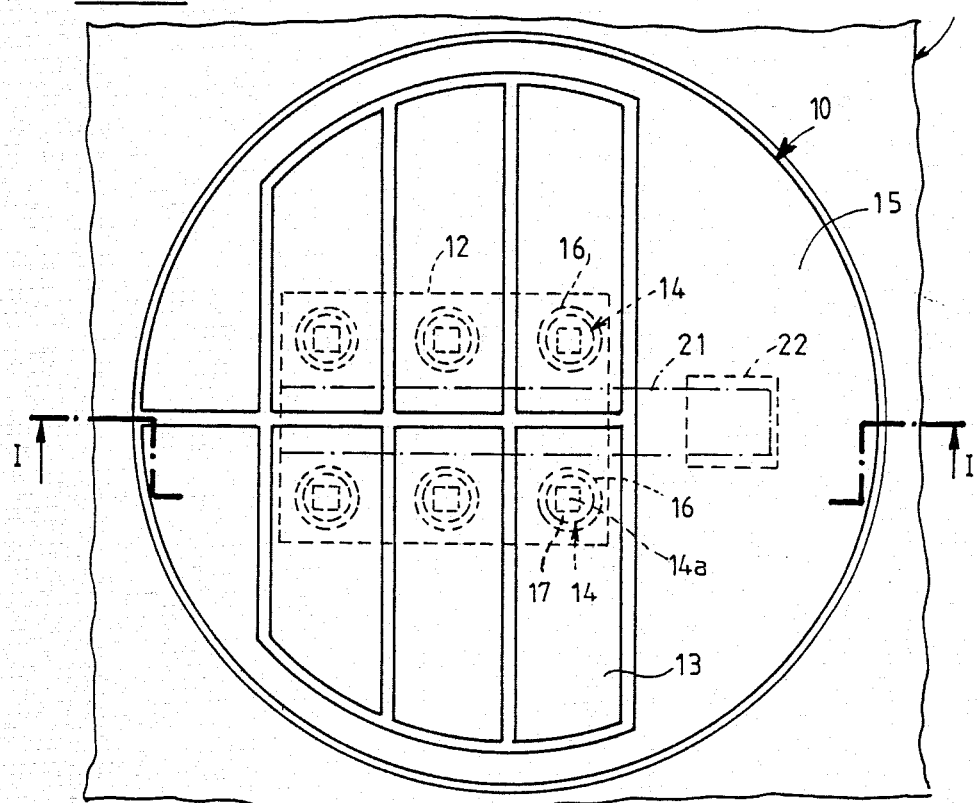
FIG. 2 is a plan view of the package and the portion of the card shown in FIG. 1.

FIGS. 1 and 2 illustrate the preferred embodiment of a carrier device for an integrated circuit. This device takes the form of a contact assembly or package 10 substantially comprising a substrate 11, a chip 12 and contacts 13.

The substrate 11 is a thin sheet of electrically insulating material, such as the material known by the registered trademark "Kapton". The face 11a of the substrate 11 is largely covered by a metal layer 15, comprising in particular the contacts 13 of the package 10. The metal layer 15 is generally formed by a thin sheet of copper foil, fixed to the face 11a of the substrate 11 by a layer of glue 18 and then suitably engraved and gold-plated. Holes 16 are made in the substrate 11 below respective contacts 13 of the metal layer 15. In practice, the six holes 16 are pierced into the substrate before the metal layer 15 is put into place. The metal layer is advantageously cut through as at 15' to establish a plurality of independent contact islands 13, each of which is disposed to overlay a chip contact or connection element 14.

On the active face 12a of the chip 12 connection elements 14 are connected to the integrated circuits of the chip. Six connection elements are included in the example shown. As in the aforementioned patent No. 2 439 322, these six connection elements 14, which are soldered to the six respective contacts 13, are the respective terminals of the chip 12. These terminals have been assigned a height approximately equal to the thickness of the substrate 11. This thickness is on the order of 0.1 mm, for a package 10 intended for use in a portable card having an ISO standardized thickness.

Figure 3A:
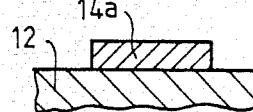
FIGS. 3A, 3B and 3C are detail views, on a larger scale, at the level of a connection hole of the package shown in FIG. 1, showing the three fundamental steps, that is, the initial, intermediate and final step, in the method for mounting a chip on a substrate according to the invention.
Figure 3B:
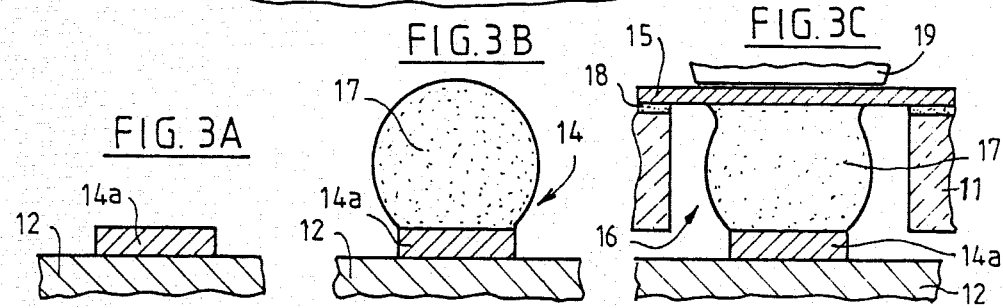
Figure 3C:
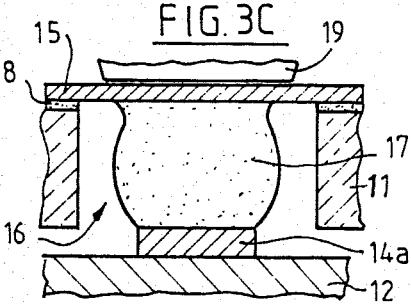

In an example according to the invention, FIGS. 3A, 3B and 3C show a first, intermediate and final step, respectively, of a method of mounting or connecting the chip 12 to the contacts 13 of the substrate 11. As shown in FIG. 3A, this method initially uses a standard chip 12, the terminals 14a of which have a height with respect to the active face 12a of the chip 12 on the order of a few micrometers, 2 $\mu$m (micrometers). FIG. 3B shows the application to each terminal 14a of a solid ball 17 of soft solder, such as tin/lead, so as to give the chip 12 terminal connections 14 having a height approximately equal to the thickness of the substrate 11.

The formation of solid balls of tin/lead is well known in the art. For example, a ball having a height on the order of 100 $\mu$m (micrometers) can be obtained by pulverizing the tin/lead ball, on the copper comprising each initial terminal 14a, to a thickness of 20 to 30 $\mu$m and then heating the solder. It will then suffice to dispose the balls 17 of the terminals 14 of the chip 12 in the corresponding holes 16 of the substrate 11 and heat the respective contacts 13 by means of a tool 19, as indicated in FIG. 3C, so as to obtain the package 10 according to the invention, which has been shown in FIGS. 1 and 2. In practice, the faces 12a of the chip and 11b of the substrate will be either in contact with or very close to one another. For the sake of clarity in the drawings, FIGS. 3A, 3B and 3C thus do not reproduce the true proportions of the elements shown.

FIG. 4 is a view similar to FIG. 3C, illustrating an alternate mode of manufacturing a package (10) in accordance with the invention. This alternate mode begins with a standard chip 12 such as that shown in FIG. 3A and disposes on each terminal 14a a conductive metal piece 17' acting as a brace, to obtain a terminal 14 in accordance with the invention. The metal piece 17' shown in FIG. 4 is a ball of copper advantageously provided with diametrically opposed flattened faces so that it can be conveniently positioned on a flat surface and soldered to the terminal 14a and later to the respective underside of contact 13. Soldering the ball 17' to the contact 13 is effected by the thermocompression tool 19 and utilization of a layer of soft solder 20, which is advantageously deposited on both flattened faces. The soft solder is deposited under the contact 13 prior to its placement on terminal 14a. A terminal having an overall height of about 100 $\mu$m is achieved using a flattened ball approximately 70 $\mu$m in height and a contact 14a approximately 30 mm in height.

FIG. 5 is a view similar to FIG. 3C, illustrating another alternate mode of manufacturing a package according to the invention. In this alternate mode, each terminal 14 according to the invention emerges from an initial highly elevated terminal 14'a, on chip 12 on top of which is a layer of gold 17''. Thus a terminal 100 $\mu$m in height can be made from an terminal that is initially 70 $\mu$m in height, plus a thick layer of gold approximately 30 $\mu$m thick. Currently, the technique used is the deposition of a layer of gold on a metal terminal made of copper or aluminum. The initial terminal 14'a may be made for example by electrodeposition. Soldering of the terminal 14 to the contact 13 is done with the tool 19 by means of thermocompression of the layer of gold 17'' against a layer of gold 20' that was deposited under the contact 13 beforehand.

Although the examples show alternate ways of forming terminals 14 to connect the terminals 14a of the chip 12 to the contacts 13 of the metal layer, it should be apparent that soldering may be done virtually regardless of the state of the metal layer 15 and thus may be done at any step of the manufacturing process from its initial state to the final state, the latter of which has been used as an example.

As shown by FIGS. 1 and 2, the package 10 may normally be limited to the use of a substrate 11, a metal layer 15 closing the holes 16 of the substrate, and a chip 12 having its terminals 14 soldered to the metal layer 15. However, in the case where the integrated circuits of the chip 12 are of the N-MOS type, it is necessary to polarize the base 12b of the chip, i.e. the underside or face opposite the active face 12a. The examples shown take this eventuality into account and propose various devices for polarization. In FIGS. 1 and 2, the polarizing device shown is formed by a conductive metal strip 21 joining the face 12b of the chip 12 to one of the contacts 13 of the metal layer 15 via a hole 22 in the substrate 11. The illustrated connection of the sheet 21 to the chip 12 and to the 13 is effected by respective layers 23 of a conductive glue, for example epoxy filled with silver. Optionally, the strip 21 may simply serve as a thermal sink. A variant realization as shown in FIG. 6 comprises replacing the strip 21 with a mass of conductive glue 24, which fills the hole 22 and lengthens it as far as one wall of the chip 12.

FIGS. 1 and 2 also show the application of the package 10 to the realization of a portable card 26. The example shown corresponds to that described in the above-cited French patent No. 2 337 381. According to this patent, the card is a simple sheet made of plastic material and provided with a multi-level cavity 27 adapted to contain and affix the package 10 in such a manner that the contacts 13 are substantially coplanar with the corresponding face of the card 26. The fixation is generally done by gluing (not shown) of the periphery of the substrate 11 on a corresponding shoulder 27a of the cavity 27, the chip 12 being disposed in the lower or deeper portion of the cavity. However, it will be appreciated that the invention is not limited to this mode of embodiment and that the package 10 may for example simply be embedded in the plastic material making up the card.

FIG. 7 shows an alternate embodiment of a device carrying integrated circuits according to the invention. In this embodiment, the device 28 has a substrate 29 which is in the form of plastic film, of the motion-picture film type, having a double row of perforations 30 spaced at regular intervals along the edges of the film. The substrate 29 is adjacent zones (31a, 31b, 31c, . . .) each of which is intended to reproduce the same structure as that of the package 10 shown in FIGS. 1 and 2. FIG. 7 thus assigns the same reference numerals to components that are analogous to those of the package 10 of FIG. 1 and 2. Accordingly, as shown in FIG. 7, the substrate 29 of each zone 31 is pierced by six holes 16 and one additional hole 22. A strip or sheet of copper 15 is then glued onto one face of the substrate 29 and engraved and gold-plated to form the contacts 13 that cover the six holes 16 and hole 22 of each zone 31 as shown.

Beginning with this initial state of the zones 31 of the film 29, at the leftmost portion of film substrate 29 as shown in FIG. 7 the steps in the method according to the invention for producing packages 10 such as those shown in FIGS. 1 and 2 are schematically illustrated. It is assumed that each successive zone is in a different phase of the method described in conjunction with FIGS. 3A, 3B, as the film unwinds in the direction of the arrow F. The zone 31a has just been positioned with respect to a chip 12 carried by a table 32 into position below contacts 13. Above the contacts 13, a tool 19 is positioned to effect soldering of these contacts to the terminals 14 of the chip 12. Soldering may be by thermocompression. The result is the configuration shown in zone 31b of the device 28. In this zone, a device for applying glue 23, for example a syringe or applicator, deposits layers of glue 23 under the chip 12 on face 12b and in the hole 22. Strip 21 is set in place against face 12b with one end in hole 22 as shown in zone 31c. This results in the configuration of the package 10 shown in FIGS. 1 and 2 and shown fragmentarily in FIG. 8 after a cutting die 34 has been used to cut the package 10 from the device 28 and place it in the cavity 27 of card 26.

It will be understood that the tool 19 is shown merely by way of example. Generally, any heating means may be used for soldering the terminals 14 either singly or collectively. For instance, a furnace may be used for collective soldering, perhaps for treating the glue. Likewise, tool 34 is shown merely by way of example, any suitable cutting and positioning means may be utilized.

FIGS. 8 and 9 are views, analogous to those of FIGS. 1 and 2, respectively, of an alternate embodiment of a package 10 according to the invention. The same reference numerals are used to designate the same elements. As shown in FIGS. 8 and 9, the contacts 13 are in a zone located outside the cavity 27 that includes the chip 12. The corresponding package 10 is accordingly called a package with staggered contacts. In the example shown, the package 10 is placed in the card such that the contacts 13 are disposed in the vicinity of the median line L parallel to the length of the card, and that the chip remains lodged in a corner of the card. Thus the strains on the chip due to bending and twisting of the card are reduced as compared to the strains undergone by a chip located at the level of the contacts 13 as shown in FIGS. 1 and 2. In the variant of FIGS. 8 and 9, the metal layer 15 comprises six strips 35, each having a downward or inward facing dimple 17 at one end and a corresponding contact 13 at the other. The contacts 13 are defined by respective holes made in a film of plastic insulating material 36 which covers the entire package 10. Optionally, the holes may be filled with conductive material. In the example shown, the center strip 35 is also connected to the strip 21 via the hole 22. Moreover, it will be appreciated that a supplementary strip 35 may be given the task of joining the strip 21 with a respective contact 12. It is also clear that all the modes of embodiment shown in FIGS. 1-9 may be adapted to one another.

What is claimed is:

1. A method of assembling an integrated circuit (12) having circuit temrinals (14a) to a substrate (11), comprising piercing holes (16) in the substrate, closing the holes by applying a metal layer (15) to one face (11a) of the substrate, forming connection elements on the terminals of the integrated circuit to a height approximately equal to the thickness of the substrate, placing the integrated circuit at an opposite face of the substrate with the connection elements received in said holes, and soldering the connection elements (14, 25) of the integrated circuit (12) to the metal layer (15).

2. A method according to claim 1, wherein the step of forming the connection element comprises forming a solid ball (17) of soft solder on each circuit terminal (14a) of the integrated circuit (12).

3. A method according to claim 1, wherein the step of forming the connection element comprises disposing a conductor element forming a brace (17') on each circuit terminal (14a) of the integrated circuit.

4. A method according to claim 1, further comprising increasing the height of the circuit terminals (14a) by electrodeposition.

5. A method according to claim 4, wherein said step of electrodeposition comprises disposing a layer of gold (17") on the initial terminals (14'a).

6. A method according to claims 1, wherein a wall of the integrated circuit (12) is bonded to the metal layer (15) via a hole (22) passing through the substrate (11) under the layer (15).

7. A carrier device (10, 28) for an integrated circuit (12), comprising a substrate (11, 29) pierced with holes (16), one face (11a, 29a) of the substrate having a metal layer (15) extending over the holes (16), and another face (11b, 29b) of the substrate having disposed adjacent thereto at least one integrated circuit (12) having connection elements (14) received in the holes and being soldered to said metal layer, said connection elements being formed on terminals (14) of the integrated circuit (12) and having a height approximately equal to the thickness of the substrate (11, 29).

8. A device according to claim 7, wherein each connection element (14) comprises a circuit terminal (14a) of the integrated circuit and a solid ball (17) of soft solder on top of said circuit terminal.

9. A device according to claim 7, wherein each connection element (14) comprises a circuit terminal (14a) of the integrated circuit and a conductor element forming a supporting brace (17').

10. A device according to claim 7, wherein each circuit terminal has an elevation (14'a) above an active surface of the integrated circuit .

11. A device according to claim 10, wherein the terminal has a thick top layer of gold (17"), the terminal and the gold layer comprising one of said connection elements.

12. A device according to claim 7, wherein the substrate (29) is a film, of the motion-picture film type, having identical adjacent zones (31a, 31b, . . . ), each of said zones including a metal layer (15) closing respective holes (16) of the substrate (29) and connected through these holes to the terminals (14, 25) of at least one integrated circuit (12), the terminals being provided with a height substantially equal to the thickness of the substrate.

13. A device according to claim 8, wherein the substrate (29) is a film, of the motion-picture film type, having identical adjacent zones (31a, 31b, . . . ), each of said zones including a metal layer (15) closing respective holes (16) of the substrate (29) and connected through these holes to the terminals (14, 25) of at least one integrated circuit (12), the terminals being provided with a height substantially equal to the thickness of the substrate.

14. A device according to claim 9, wherein the substrate (29) is a film, of the motion-picture film type, having identical adjacent zones (31a, 31b, . . . ), each of said zones including a metal layer (15) closing respective holes (16) of the substrate (29) and connected through these holes to the terminals (14, 25) of at least one integrated circuit (12), the terminals being provided with a height substantially equal to the thickness of the substrate.

15. A device according to claim 10, wherein the substrate (29) is a film, of the motion-picture film type, having identical adjacent zones (31a, 31b, . . . ), each of said zones including a metal layer (15) closing respective holes (16) of the substrate (29) and connected through these holes to the terminals (14, 25) of at least one integrated circuit (12), the terminals being provided with a height substantially equal to the thickness of the substrate.

16. A device according to claim 11, wherein the substrate (29) is a film, of the motion-picture film type, having identical adjacent zones (31a, 31b, . . . ), each of said zones including a metal layer (15) closing respective holes (16) of the substrate (29) and connected through these holes to the terminals (14, 25) of at least one integrated circuit (12), the terminals being provided with a height substantially equal to the thickness of the substrate.

17. A device according to claim 7 wherein the metal layer (15) which closes the holes (16) comprises respective contacts (13) of the device.

18. A device according to claim 17 further including an insulating film cover (36) over the metal layer, the film cover being provided with openings therein to the metal layer which define the contacts (13).

19. A device according to claim 7, wherein the metal layer (15) comprises strips (35) each having a dimple (17) at one end and a contact (13) at another end.

20. A device according to claim 19 further including an insulating film cover (36) over the strips, the film cover being provided with openings therein to the strips which define the contacts (13).

21. A carrier device
for an integrated circuit comprising a substrate (11, 29) pierced with holes (16), one face (11a, 29a) of the substrate having a metal layer (15) extending over the holes, and another face (11b, 29b) of the substrate having disposed adjacent thereto at least one integrated circuit (12) having connection elements (14, 17) received in the holes and being soldered to said metal layer, said connection elements being formed on terminals (14) of the integrated circuit and having a height approximately equal to the thickness of the substrate, and polarizing means (21, 24) between a wall of the integrated circuit and the metal layer, the polarizing means being connected to the metal layer via a hole (22) passing through the substrate under the metal layer.

22. A device according to claim 21, wherein the polarizing means is a conductive metal strip (21) fixed to a back surface (12b) of the integrated circuit (12).

23. A device according to claim 21, wherein the polarizing means is a conductive glue (24).

24. An electronic microcircuit card , comprising a card, and a contact assembly carried by the card, the contact assembly comprising a substrate having holes therethrough and having a plurality of metal strips on one face thereof, the metal strips covering the holes and forming contacts which are accessible at an outer surface of the card, at least one integrated circuit disposed in the card at an opposite face of the substrate, said integrated circuit having connection elements having a height approximately equal to a thickness of the substrate, the connection elements extending through corresponding ones of said holes and being soldered to corresponding ones of said metal strips.

25. A card according to claim 24, wherein the integrated circuit (12) is placed in a corner of the card, and the metal strips are formed such that the contacts (13) are located in a median zone of the card.

* * * * *

UNITED STATES PATENT AND TRADEMARK OFFICE
CERTIFICATE OF CORRECTION

PATENT NO. : 4,774,633

DATED : September 27, 1988

INVENTOR(S) : Dehaine et al

It is certified that error appears in the above-identified patent and that said Letters Patent is hereby corrected as shown below:

Column 8, line 38 (Claim 5, line 3) delete "initial".

Signed and Sealed this

Eleventh Day of July, 1989

*Attest:*

DONALD J. QUIGG

*Attesting Officer*  *Commissioner of Patents and Trademarks*